United States Patent [19]

Hirata

[11] Patent Number: 5,449,940
[45] Date of Patent: Sep. 12, 1995

[54] SEMICONDUCTOR INTEGRATED CIRCUIT HAVING IMPROVED PROTECTION ELEMENT

[75] Inventor: Morihisa Hirata, Tokyo, Japan
[73] Assignee: NEC Corporation, Tokyo, Japan
[21] Appl. No.: 890,105
[22] Filed: May 29, 1992
[30] Foreign Application Priority Data May 29, 1991 [JP] Japan .................. 3-124241

[51] Int. Cl.⁶ .......................................... H01L 29/34
[52] U.S. Cl. .................... 257/360; 257/355; 257/356; 257/358; 257/361
[58] Field of Search ............... 257/360, 361, 358, 355, 257/356, 388

[56] References Cited

U.S. PATENT DOCUMENTS

| | | | |
|---|---|---|---|
| 4,282,556 | 8/1981 | Ipri | 257/360 |
| 4,602,267 | 7/1986 | Shirato | 357/35 |
| 4,893,157 | 1/1990 | Miyazawa et al. | 357/23.13 |
| 4,924,339 | 5/1990 | Atsumi et al. | 361/56 |
| 4,937,639 | 6/1990 | Yao et al. | 357/23.13 |
| 4,990,984 | 2/1991 | Misu | 357/23.13 |
| 5,027,252 | 6/1991 | Yamamura | 361/58 |

FOREIGN PATENT DOCUMENTS 60-10767 1/1985 Japan .
2186426 8/1987 United Kingdom .

OTHER PUBLICATIONS

Patent Abstracts of Japan, vol. 10, No. 201, 15 Jul. 1986, JP-A-61-043 468.
Patent Abstracts of Japan, vol. 5, No. 44, 24 Mar. 1981, JP-A-55 166 953.

*Primary Examiner*—Rolf Hille
*Assistant Examiner*—Valencia M. Wallace
*Attorney, Agent, or Firm*—Sughrue, Mion, Zinn, Macpeak & Seas

[57] ABSTRACT

A protective device for protecting a CMOS circuit included in an internal circuit of an IC against overvoltage applied to a power source wiring and preventing the CMOS from being latched-up by surge voltage due to external noise during a normal operation of the IC is disclosed. An N channel MOS FET and a P channel MOS FET are arranged in parallel to each other and connected between a power source wiring and a ground wiring. Gate electrodes of the N channel and the P channel MOS FETs are connected to the ground wiring and the power source wiring, respectively. Positive overvoltage or surge voltage applied to the power source wiring is relieved by breakdown of drain junctions of both the MOS FETs.

6 Claims, 7 Drawing Sheets

SEMICONDUCTOR INTEGRATED CIRCUIT HAVING IMPROVED PROTECTION ELEMENT

BACKGROUND OF THE INVENTION

The present invention relates to a semiconductor integrated circuit and, particularly, to a protection circuit for protecting a semiconductor integrated circuit against overvoltage applied to a source terminal or ground terminal thereof due to electrostatic charge.

In a CMOS integrated circuit of twin-well type, a P well and an N well are provided in a surface portion of, for example, a P type silicon substrate. An N channel MOS FET is formed in the P well and a P channel MOS FET is formed in the N well. A P+ diffusion layer (substrate contact region) selectively formed in a surface portion of the P well and a source region of the N channel MOS FET are connected to a ground terminal through a first metal film such as an aluminum film. Similarly, an N+ diffusion layer (well contact region) formed selectively in a surface portion of the N well and a source region of the P channel MOS FET are connected to the ground terminal through another first metal film.

When a positive overvoltage is applied to a source terminal thereof, current flows from the well contact region and the source region of the P channel MOS FET to the ground terminal through the N well, the P well (assuming that the N and P wells are in contact with each other), the substrate contact region and the source region of the N channel MOS FET.

That is, discharge occurs due to breakdown of a PN junction formed by the N well and the P well. The breakdown voltage is usually about 70 volts.

When a positive overvoltage is applied to the ground terminal, current flows through the substrate contact region, the P well, the N well and the well contact region to the source terminal.

Thus, the CMOS circuit itself has a certain protective function. However, the breakdown voltage of a diode formed between the aforementioned wells is so high that it is necessary to provide a specific protection circuit if the thickness of a gate oxide film is small.

There are various schemes in such a protection circuit. Among them, a protection circuit using field effect transistors is practical since it can be realized without adding any new step to a fabrication process for the semiconductor integrated circuit. This protection circuit is disclosed in Japanese Laid-Open (Kokai) patent application 60-10767. In this Kokai, a parallel circuit of first and second field effect transistors which are MOS FETs having field oxide films as their gate oxide films, respectively, are inserted between a power source source wiring and a ground wiring, a gate electrode of the first field effect transistor is connected to the power source source wiring and a gate electrode of the second field effect transistor is connected to the ground terminal.

When a positive overvoltage exceeding a threshold voltage of the first field effect transistor is applied to the power source source terminal, the first field effect transistor is turned on to allow current to flow to the ground wiring. Although, when a positive overvoltage is applied to the ground terminal, the second field effect transistor does not operate as a MOS FET (since its gate electrode and the substrate are connected to the ground wiring), current flows to the power source source wiring through a PN junction between regions of the substrate-source/drain regions which are connected to the power source wiring.

Electrostatic discharge upon which such positive overvoltage is applied to the power source terminal takes the form of channel current of the first field effect transistor. However, the resistance of the MOS FET when in the conduction state may be at least several times that of a bipolar transistor. When the thickness of a gate oxide film of a MOS FET of an internal circuit is 10 to 20 nm, the channel width of the first field effect transistor should be about 2000 $\mu$m. Thus, the protection circuit comprising field effect transistors has a low electrostatic discharge ability which affects integration density.

SUMMARY OF THE INVENTION

An object of the present invention is to provide a semiconductor integrated circuit having a protection circuit which has high electrostatic discharge ability and can be realized without requiring any special additional step.

A semiconductor integrated circuit according to the present invention includes a semiconductor chip in which a first power source wiring connectable to a bonding pad to which a first power source voltage Vdd and a second wiring connectable to a bonding pad to which a second power source voltage Vss is supplied. The protection circuit includes an N channel MOS FET having a drain region and a source region connected to the first power source wiring and the second power source wiring, respectively, and a P channel MOS FET having a source region and a drain region connected to the first power source wiring and the second power source wiring, respectively. A gate electrode of the N channel MOS FET and a gate electrode of the P channel MOS FET are connected to the second power source wiring and the first power source wiring preferably through film resistor elements, respectively. An internal circuit includes a CMOS circuit in at least a portion thereof.

The protection circuit functions to protect a gate insulating film of the internal CMOS circuit against overvoltage applied to the power source terminal due to electrostatic charge and to prevent a latch-up during normal operation of the CMOS circuit.

A positive overvoltage applied to the first power source terminal causes drain junctions of the N and P channel MOS FETs of the protection circuit to be broken-down to thereby allow discharge to occur. Since this does not utilize channel currents of the MOS FETs, dischargeability of the protection circuit is high, making the protection circuit possible to be compact.

A positive overvoltage applied to the second power source terminal makes the drain junctions of the MOS FETs forward to allow discharge to occur.

When a surge voltage appears at the first power source terminal due to external noise during normal operation and when a potential at an input terminal of the internal circuit is either the second power source potential or the first power source potential, the drain junction of the N or P channel MOS FET of the protection circuit is broken-down before the drain junction of the N or P channel MOS FET of the internal circuit is broken-down, preventing the latch-up of the internal circuit from occurring.

This protection circuit can be realized with high reproducibility by a combination of conventional processes of a semiconductor integrated circuit fabrication.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
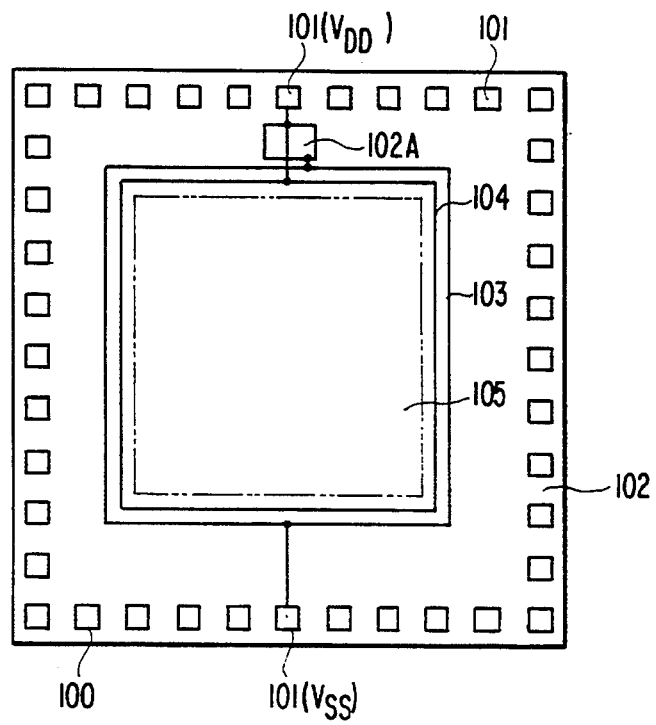
FIG. 1 is a schematic plan view of a semiconductor chip according to a first embodiment of the present invention.

Referring to FIG. 1 showing a first embodiment of the present invention, a plurality of bonding pads 101 are formed in a peripheral portion of a 5 mm×5 mm, square semiconductor chip 100. In a buffer region 102 of the chip which is inside of the region in which the bonding pads 101 are formed, a protection circuit 102A and an input protection circuit, etc., which are not shown are formed. Further, a ground wiring 103 is formed inside of the buffer region 102 and connected to a bonding pad 101(Vss) which is a ground terminal and to the protection circuit 102A. A power source wiring 104 is provided inside of the ground wiring 103 and connected to a bonding pad 101(Vdd) which is a power source terminal and the protection circuit. Inside of the power source wiring 104, an internal circuit region 105 is defined as shown by a chain line, in which an internal circuit (106) is formed. The internal circuit may include a digital circuit or circuits, an analog circuit or circuits or both of them. However, a digital circuit or circuits having CMOS construction is included in at least a portion thereof. In the following description, the digital circuit is exemplified by a CMOS inverter. In the internal circuit region 105, a ground wiring (not shown) and a power source wiring (not shown) which are connected, respectively, to the ground wiring 103 and the power source wiring 104 are arranged in, for example, lattice form.

Figure 2:
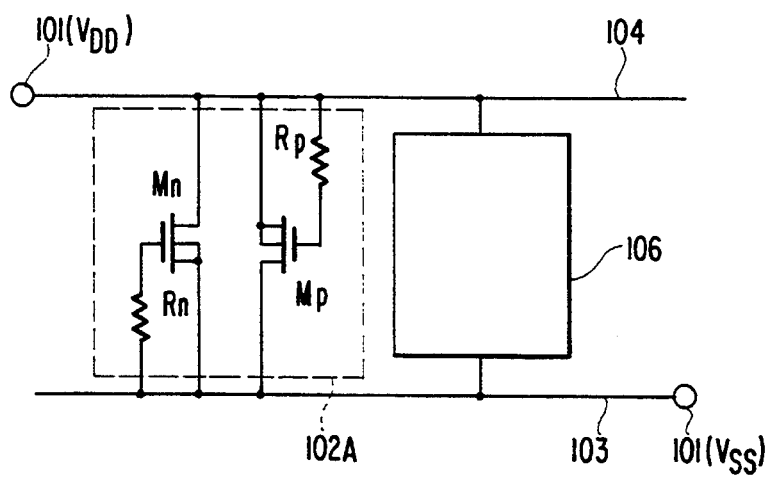
FIG. 2 is a circuit diagram of the first embodiment.

Referring to FIG. 2, the first embodiment of the present invention includes, between the power source wiring 104 and the ground wiring 103, a parallel connection of an N channel MOS FET Mn and a P channel MOS FET Mp. A gate electrode of the N channel MOS FET Mn is connected to the ground wiring 103 through a film resistor element Rn and a gate electrode of the P channel MOS FET Mp is connected to the power source wiring 104 through a film resistor element Rp. The internal circuit 106 is connected to the power source wiring 104 and the ground wiring 103.

Figure 3:
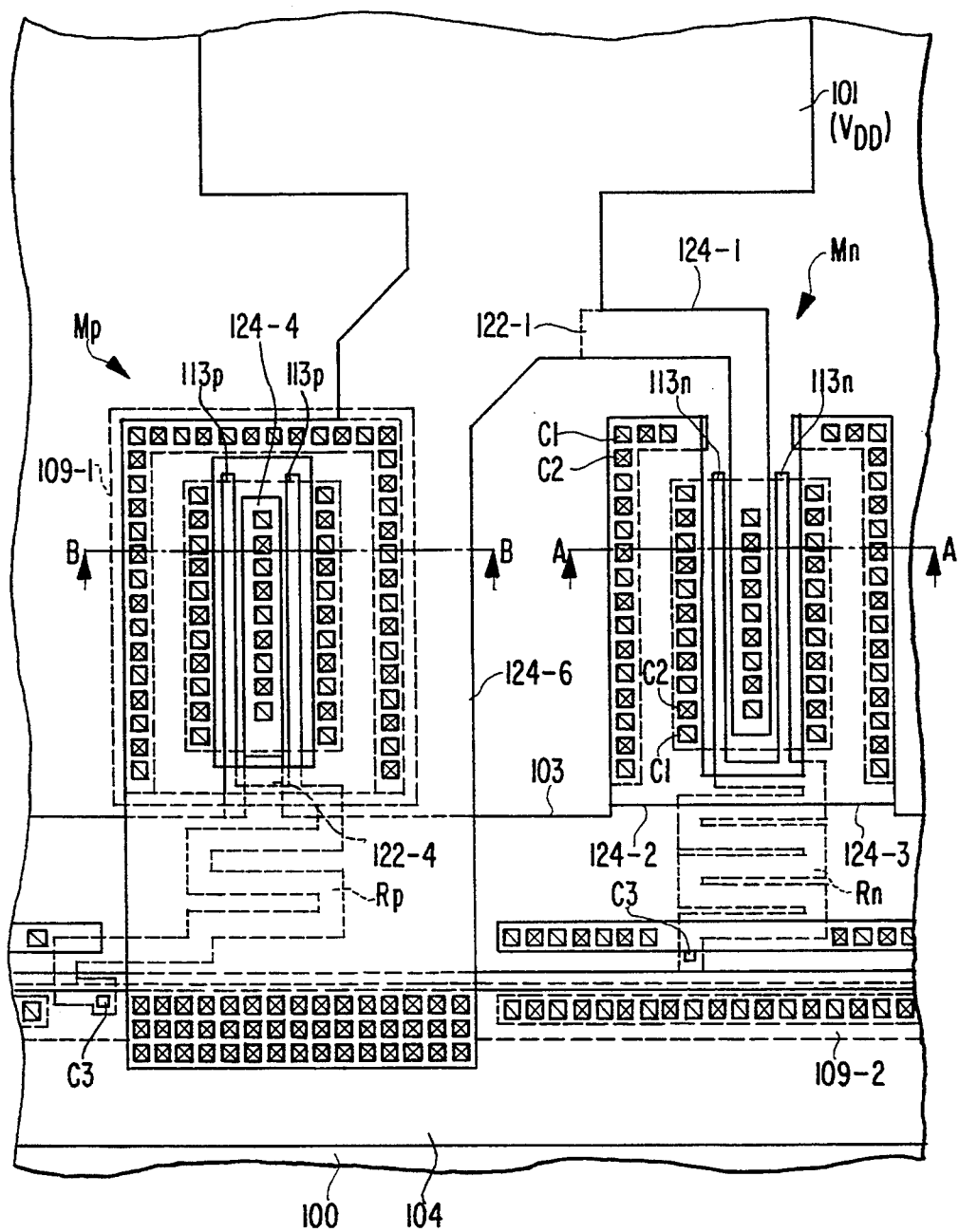
FIG. 3 is a plan view of a semiconductor chip showing a protection circuit portion according to the first embodiment.
Figure 4A:
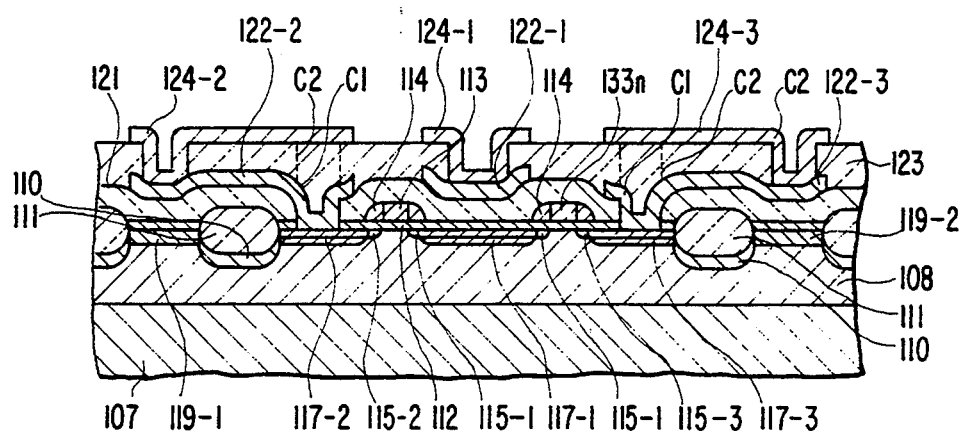
FIG. 4(a) is a cross section taken along a line A—A in FIG. 3, showing an N channel MOS FET Mn and a film resistor element Rn in FIG. 2.
Figure 4B:
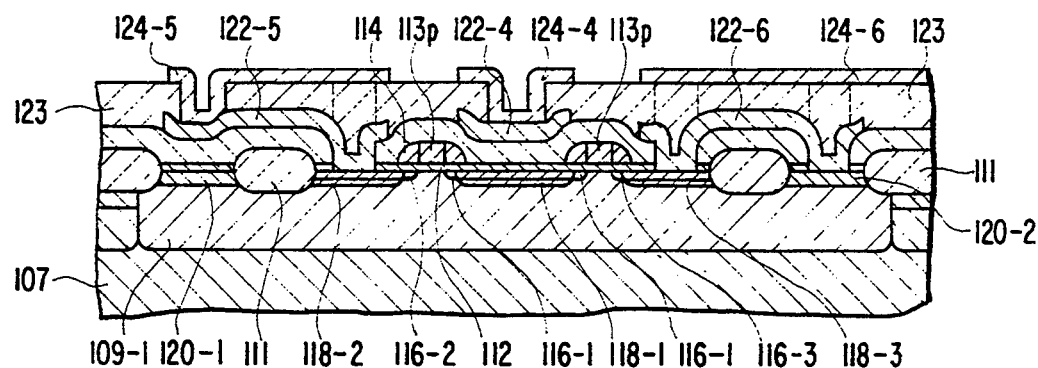
FIG. 4(b) is a cross section taken along a line B—B in FIG. 3, showing a P channel MOS FET Mp and a film resistor element Rp.
Figure 4C:
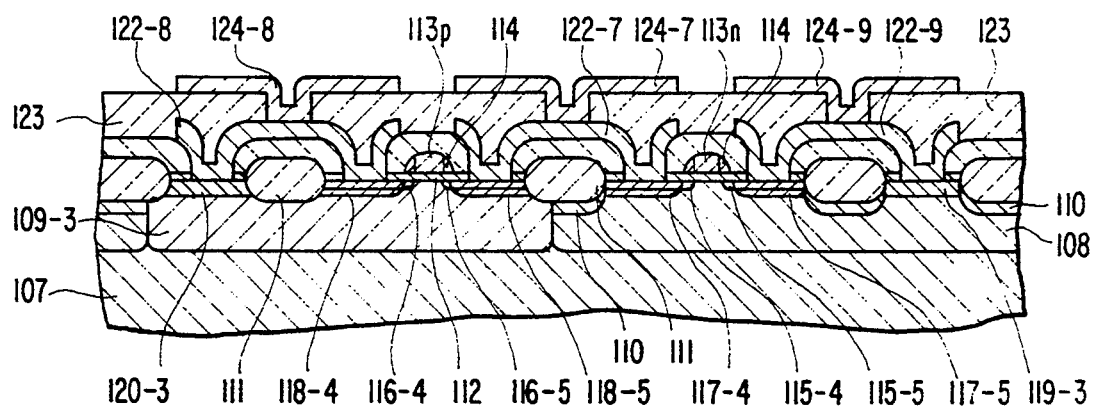
FIG. 4(c) is a cross section of a CMOS inverter of an internal circuit in the first embodiment.

Referring to FIGS. 3 and 4, both the N channel MOS FET Mn and the P channel MOS FET Mp are of ladder type MOS transistors and total channel widths thereof are about 450 μm, respectively. It should be noted that, in FIG. 3 which shows the basic structure of the MOS FET, the channel width is illustrated in reduced scale.

A P well 108 whose impurity density is $1 \times 10^{17} \text{cm}^{-3}$ is formed in a surface portion of a P type silicon substrate 107 whose impurity density is $1 \times 10^{15} \text{cm}^{-3}$ and an N well 109-1 whose impurity density is $1 \times 10^{17} \text{cm}^{-3}$ and N wells 109-2 and 109-3 are provided adjacent to the P well 108, for a P channel MOS FET of the protection circuit, for a guard ring and for the internal circuit, respectively. A transistor forming region of the chip is partitioned to a plurality of electrically isolated regions by field oxide films 111, in a surface portion of which gate oxide film 112 each 15 nm thick are provided. In the portions of the N wells 109-1, 109-2 and 109-3, P type channel stoppers 110 terminating at a bottom surface of the respective field oxide films 111 are provided. A gate electrode 113n of the N channel MOS FET and a gate electrode 113p of the P channel MOS FET are formed by selectively covering the gate oxide films 112 with polycide films (formed by covering polysilicon film with tungsten silicide film) 1.3 μm wide and 300 nm thick. The gate electrodes 113p and 113n are provided with side wall spacers 114, respectively. Low impurity density N type diffusion layers 115-1, 115-2, . . . , 115-5 having impurity density of $1 \times 10^{18} \text{cm}^{-3}$ are provided in self-alignment manner with respect to the respective gate electrodes 113n. Similarly, high impurity density N type diffusion layers 117-1, 117-2, . . . , 117-5 having impurity density of $1 \times 10^{20} \text{cm}^{-3}$ are provided. Reference numerals 116-1, 116-2, . . . , 116-5 depict low impurity density P type diffusion layers having impurity density of $1 \times 10^{18} \text{cm}^{-3}$ and 118-1, 118-2, . . . , 118-5 depict high impurity density P type diffusion layers having impurity density of $1 \times 10^{20} \text{cm}^{-3}$. That is, the protection circuit 102A and the internal circuit 106 include N channel MOS FETs and P channel MOS FETs both having LDD structure.

The high impurity density diffusion layer 117-1 in the drain region of the N channel MOS FET Mn is connected to a first layer metal wiring 122-1 through a contact hole C1 (indicated by a square mark having a diagonal line) provided in a first interlayer insulating film 121 and the first layer metal wiring is connected to a second layer metal wiring 124-1 through a through-hole C2 (indicated by a square mark having crossed diagonal lines) formed in a second interlayer insulating film 123. The high impurity density N type diffusion layers 117-2 and 117-3 in the source region are connected to the first layer metal wirings 122-2 and 122-3 through contact holes C1, similarly respectively. The first layer metal wiring 122-2 is further connected to a P+ type diffusion layer 119-1 (substrate contact region) through a contact hole C1 and to the second layer metal wiring 124-2 through a through-hole C2. Similarly, the first layer metal wiring 122-3 is connected to the P type diffusion layer 119-2 and the second layer metal wiring 124-3. The first layer metal wirings 122-2 and 122-3 are connected to the ground wiring 103 (first layer metal wiring). The gate electrode 113n of the N channel MOS FET Mn is connected to the ground wiring 103 via the film resistor element Rn through a through-hole C3. The film resistor element Rn is composed of a polycide film 3.75 $\mu$m wide and 150 $\mu$m long and has resistance value of several hundreds ohms.

The high impurity density diffusion layer 118-1 in the source region of the P type MOS FET Mp is connected to the first layer metal wiring 122-4 through a contact hole C1 and the first layer metal wiring 122-4 is connected to the second layer metal wiring 124-4 through a through-hole C2. The high impurity density P type diffusion layers 118-2 and 118-3 in the drain region are connected to the first layer metal wirings 122-5 and 122-6 through contact holes C1, respectively. The first layer metal wirings 122-5 and 122-6 are connected to N+ type diffusion layers 120-1 and 120-2 through contact holes C1, respectively, and to the second layer metal wirings 124-5 and 124-6 through through-holes C2, respectively. The first layer metal wiring 122-4 is connected to the ground wiring 103. The second layer metal wirings 124-5 and 124-6 are joined together to form a wider wiring which is connected to the power source wiring 104 through a through-hole C2. The gate electrode 113p of the P channel MOS FET Mp is connected to the power source wiring 104 through a film resistor element Rp via a through-hole C3. The film resistor element Rp is composed of a polycide film 3.75 $\mu$m wide and 150 $\mu$m long and has resistance value of several hundreds ohms.

The N type diffusion layer 117-4 in the drain region of the N channel MOS FET of the CMOS inverter is connected to the first layer metal wiring 122-7 through a contact hole and to the high impurity density P type diffusion layer 118-5. The high impurity density P and N type diffusion layers 118-4 and 117-5 of the respective source regions of the P and N channel MOS FETs of the CMOS inverter are connected to the P+ and N+ type diffusion layers 120-3 and 119-3 through the first layer metal wirings 122-8 and 122-9. The first layer metal wiring 122-8 is connected to the electrode wiring 104 or its branch through the second layer metal wiring 124-8. The first layer metal wiring 122-7 is connected to the second layer metal wiring 124-7 which is an output signal line of the CMOS inverter. The first layer metal wiring 122-9 is connected to the ground wiring 103 or its branch through the second layer metal wiring 124-9.

The gate electrodes 113n and 113p are connected to bonding pads for input terminals through first and second layer metal wirings not shown, respectively.

A protective function of the first embodiment will now be described.

When overvoltage which is positive with respect to the ground terminal is applied to the power source terminal due to electrostatic charge, etc., the PN junctions between the drain regions and the wells of the N and P channel MOS FET Mn and Mp are broken down in avalanche, respectively. For the N channel MOS FET Mn, a large amount of holes are injected into the P well 108 and an NPN transistor Qn composed of the drain region, the P well and the source region thereof is turned on to discharge electric charges. Similarly, a large amount of electrons are injected to the N well 109-1 and a PNP transistor Qp composed of the drain region, the N well and the source region of the P channel MOS FET Mp is turned on to cause discharge to occur. This discharge is performed by the bipolar transistor and therefore it is more than the channel current of the MOS FET.

When an overvoltage which is positive with respect to the power source terminal is applied to the ground terminal, the PN junctions between the drain regions and the wells of the N channel MOS FET Mn and the P channel MOS FET Mp become forward biased, so that current flows from the ground wiring 103 to the power source wiring 104.

The film resistor elements Rn and Rp are current limiting resistor for limiting currents flowing through the gate oxide films when overvoltage is applied to the gate electrodes of the N channel MOS FET Mn and the P channel MOS FET Mp.

In this embodiment, an electrostatic discharge (ESD) breakdown voltage of 3000 volts was confirmed. That is, an output voltage of 3000 volts of a high voltage source was applied across a capacitor of 100 pF to charge it and thereafter the capacitor was connected between the power source terminal and the ground terminal through a resistor of 1.5 k$\Omega$ connected thereto with appropriate polarity. There was no abnormality observed. In this experiment, 100 sample chips were tested under the same conditions.

An operation of the protection circuit when surge voltage is generated due to external noise during a normal operation of the circuit will be described.

It is assumed that surge voltage is generated at the power source terminal when an input voltage Vin of the CMOS inverter of the internal circuit is at ground potential. Without this protective circuit, the output voltage Vout of the CMOS inverter would be increased to break down the PN junction in the drain region of the N channel MOS FET of the CMOS inverter to thereby flow current from the drain region to the P well 108. If this current is large enough, the potential of the P well 108 would increase to thereby produce a large amount of electrons to be directed to the source region (117-5). These electrons diffuse to the N well 109-3 to lower the potential thereof. Therefore, holes are injected thereto from the source region (118-4) of the P channel MOS FET, which diffuse to the P type silicon substrate 107 to increase its potential. A positive feedback is thus established, causing the so-called latch-up phenomenon to occur.

Since the output voltage Vout of the CMOS inverter increases through a channel resistance of the P channel MOS FET, the increase starts at a time slightly delayed from the generation of surge voltage at the source terminal. Therefore, it is possible to prevent the latch-up from occurring if a drain junction breakdown voltage of the protective circuit is not higher than that of the N channel MOS FET of the internal circuit. In this embodiment, this requirement is satisfied since the N channel MOS FET Mn of the protective circuit and the N channel MOS FET of the internal circuit have the same drain junction. Further, although breakdown voltages of the drain junctions of the N channel MOS FET and the P channel MOS FET are the same in design, they are not always the same practically. Therefore, it is possible to prevent the latch-up more reliably when the drain junction breakdown voltage of the P channel MOS FET is lower than that of the N channel MOS FET.

In a case where the input voltage Vin is the power source voltage, such latch-up may be produced due to breakdown of the drain junction of the P channel MOS FET of the CMOS inverter. Therefore, the latch-up can be prevented if the drain junction breakdown voltage of the protective circuit is not higher than that of the P channel MOS FET of the CMOS inverter. This requirement may be satisfied by the P channel MOS FET Mp of the protective circuit to some extent and there may be a case where the latch-up is prevented more reliably by the N channel MOS FET M. If the protection circuit is constituted with only N channel MOS FETs Mn, this requirement may be not always satisfied practically.

A second embodiment of the present invention will be described next.

Figure 5A:
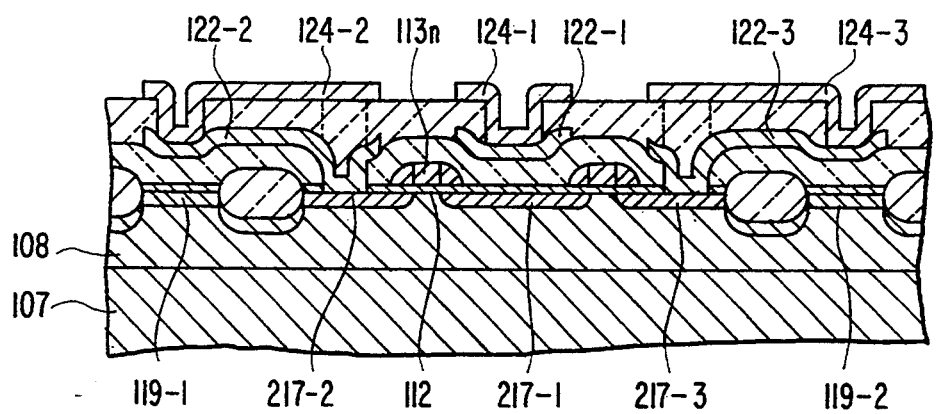
FIG. 5(a) is a cross section showing an N channel MOS FET Mn in a second embodiment of the present invention.
Figure 5B:
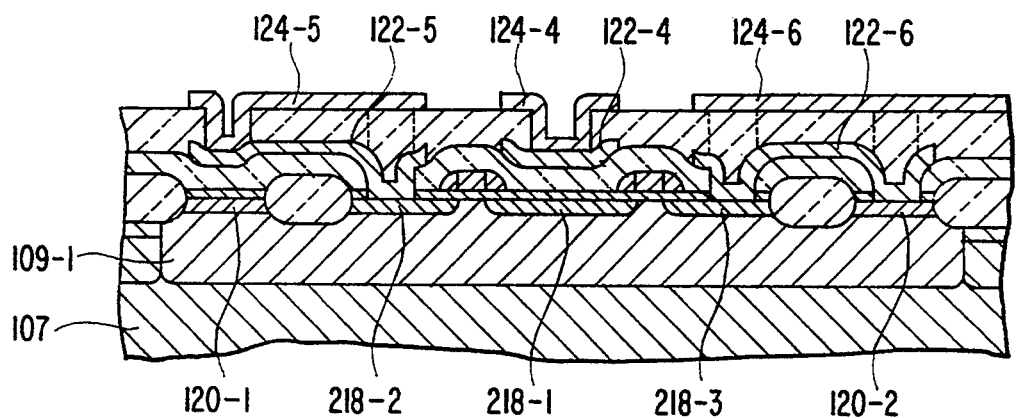
FIG. 5(b) is a cross section showing a P channel MOS FET Mp in the second embodiment.

As shown in FIG. 5, in the second embodiment of the present invention, a source/drain region of an N channel MOS FET Mn is formed from high impurity density N type diffusion layers 217-1, 217-2 and 217-3 and a source/drain region of a P channel MOS FET Mp is formed from high impurity density diffusion layers 218-1, 218-2 and 218-3. An internal circuit may be identical to that in the first embodiment. Since therefore, breakdown voltage (11 volts) of a drain junction of the protective circuit is lower than breakdown voltage (12 volts) of a drain junction of the internal circuit (LDD structure), this embodiment is superior in ESD breakdown voltage and latch-up prevention than the first embodiment.

A fabrication of the chip according to the second embodiment of the present invention will be described.

According to any of conventional technique, N wells 109-1, . . . , and a P well 108 are formed in a surface of a P type silicon substrate, transistor forming regions, etc., are isolated from each other by field oxide films 111, and gate oxide films 112, gate electrodes 113n and 113p and film resistor elements Rn and Rp are formed in the transistor forming regions.

Figure 6A:
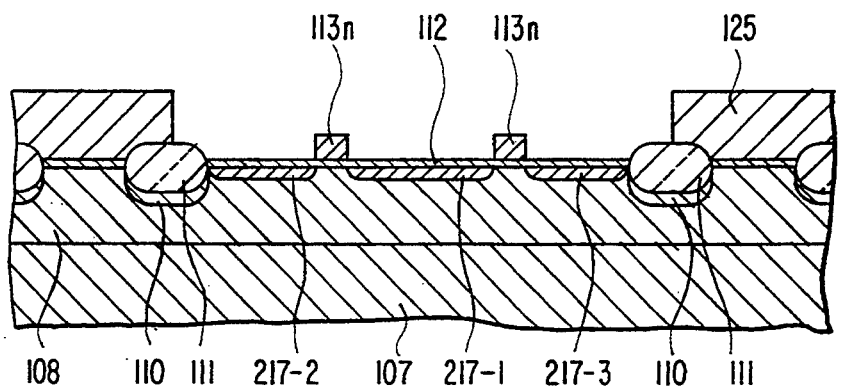
FIG. 6(a) is a cross section of the N channel MOS FET Mn for explanation of fabrication method of the second embodiment.
Figure 6B:
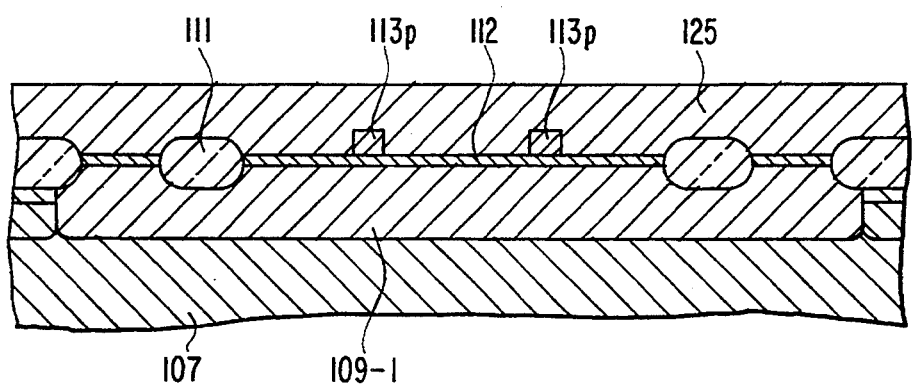
FIG. 6(b) is a cross section of the P channel MOS FET Mp for explanation of fabrication method of the second embodiment.
Figure 6C:
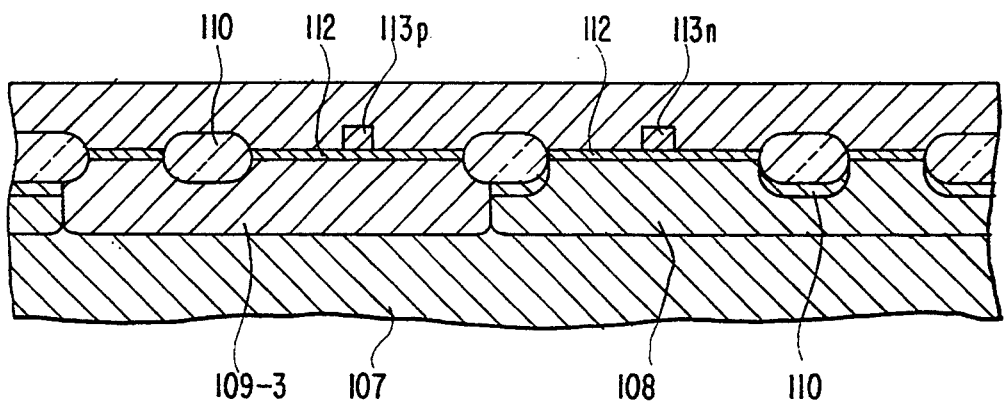
FIG. 6(c) is a cross section of the CMOS inverter portion for explanation of fabrication method of the second embodiment.

Then, as shown in FIG. 6, an ion injection mask such as photo resist film 125 having an opening in a region in which an N channel MOS FET Mn of a protective circuit is to be formed is formed on an entire surface of the wafer. Arsenic ion is injected into the region through the opening of the mask at dose of 1 to $5 \times 10^{15} cm^{-2}$ with acceleration voltage of 50 to 100 keV and high impurity density N type diffusion layers 217-1, 217-2 and 217-3, impurity density being $1 \times 10^{20} cm^{-3}$, are formed by lamp annealing.

Figure 7A:
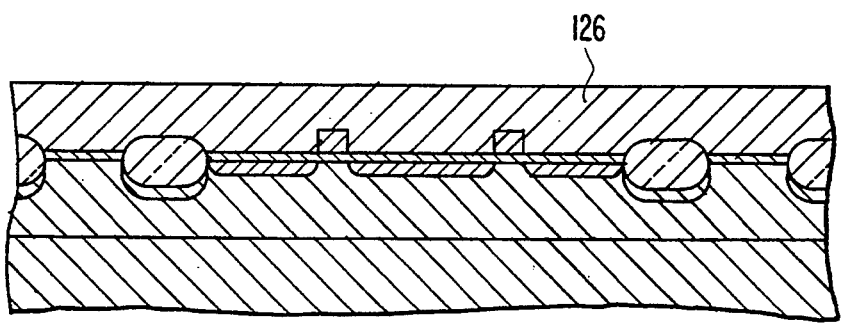
FIG. 7(a) is a cross section of the N channel MOS FET portion for explanation of a fabrication step corresponding to subsequent step to that shown in FIG. 6.
Figure 7B:
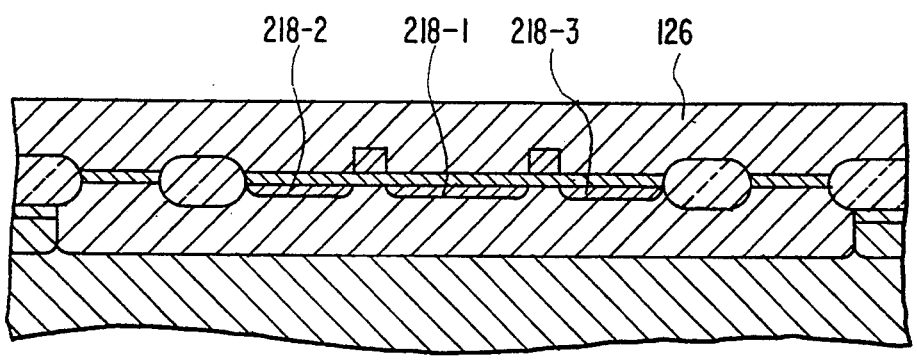
FIG. 7(b)) is a cross section of the P channel MOS FET similar FIG. (a)
Figure 7C:
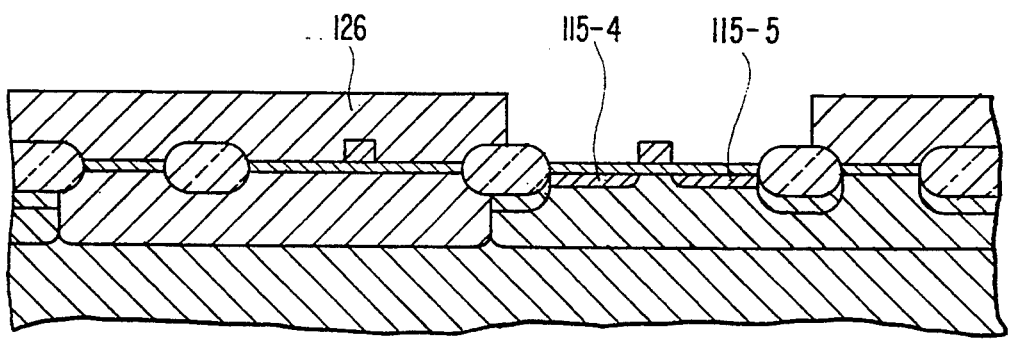
FIG. 7(c) is a cross section of the CMOS inverter portion similar to FIG. 7 (a)

Boron fluoride ion is similarly injected at dose of 1 to $5 \times 10^{15} cm^{-2}$ with acceleration voltage of 50 to 100 keV and high impurity density P type diffusion layers 218-1, 218-2 and 218-3 of impurity density of $1 \times 10 cm^{-3}$ are formed by lamp annealing, as shown in FIG. 7. Then, an ion injection mask such as photo resist film 126 having an opening in a region in which an N channel MOS FET of the internal circuit is to be formed is formed on the wafer, through which phosphor ion is injected at dose of 1 to $5 \times 10^{13} cm^{-2}$ with acceleration voltage of 50 to 150 keV. By lamp annealing it, low impurity density N type diffusion layers 115-4 and 115-5 of impurity density of $1 \times 10^{18} cm^{-3}$ formed.

Figure 8A:
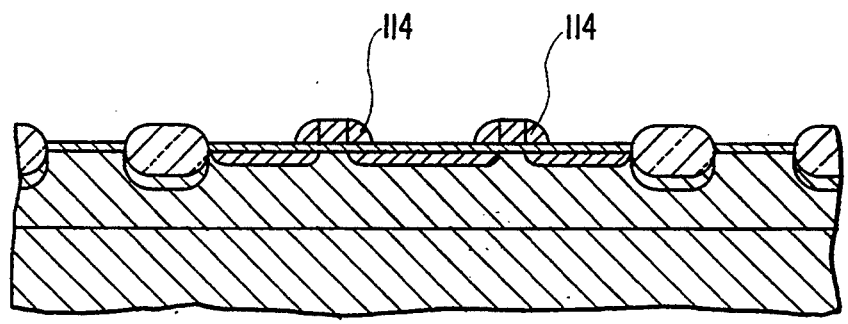
FIG. 8(a) is a cross section of the N channel MOS FET portion for explanation of a fabrication step corresponding to a subsequent step to that shown in FIG. 7.
Figure 8B:
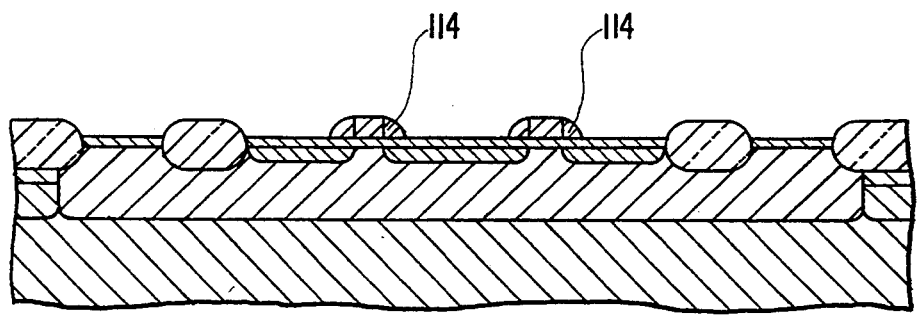
FIG. 8(b) is a cross section of the N channel MOS FET similar to FIG. 8(a)
Figure 8C:
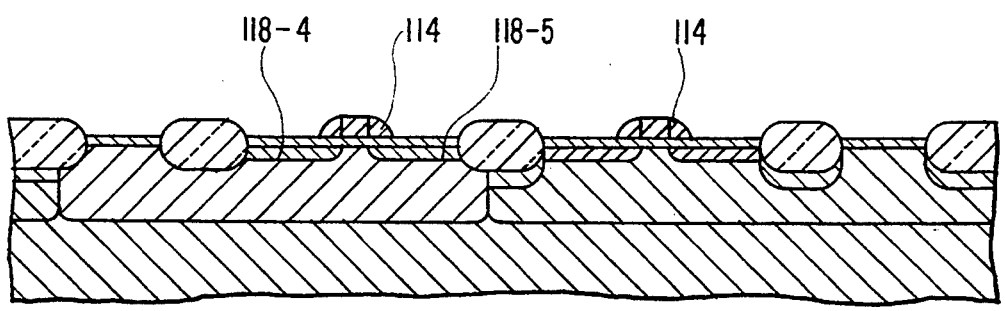
FIG. 8(c) is a cross section of the CMOS inverter portion similar to FIG. 8(a).

Thereafter, boron ion is injected similarly at dose of 1 to $5 \times 10^{13} cm^{-2}$ with acceleration voltage of 10 to 50 keV, resulting in low impurity density P type diffusion layers 118-4 and 118-5 having impurity density of $1 \times 10^{18} cm^{-3}$ are formed, as shown in FIG. 8.

Then, a silicon oxide film 100 to 300 nm thick is deposited thereon and sidewall spacers 114 of the gate electrodes are formed by anisotropic etching.

Then, high impurity density N type diffusion layers 117-4 and 117-5 (FIG. 4) and N+ diffusion layers 120-3 (FIG. 4), 120-1 and 120-2 (FIG. 5) are formed by arsenic ion injection and high impurity density P type diffusion layers 118-4 and 118-5 (FIG. 4) and P+ type diffusion layers 119-3 (FIG. 4) and 119-1 and 119-2 (FIG. 5) are formed by ion injection of boron. Then, a first interlayer insulating film is deposited thereon. Contact holes C1 are formed therein and a first layer metal film is deposited thereon. The first layer metal film is patterned and a second interlayer insulating film is deposited thereon. Through-holes C2 are formed in the second interlayer insulating film on which a second layer metal film is deposited and then the second layer metal film is patterned.

In this fabrication method, the number of ion injection steps is larger than that in the first embodiment due to the fact that the high impurity density N type diffusion layers 217-1, etc., and the high impurity density P type diffusion layers 218-1, etc., are formed. However, the increased steps do not include any difficulty and therefore can be realized easily.

In the described embodiments, the gate oxide films of the MOS FET of the protective circuit and the internal circuit are identical in design. However, the gate oxide film of the MOS FET of the protective circuit may be made thicker than that of the internal circuit by, for example, 20 nm. In such case, the durability of the protective circuit may be improved. In order to realize such difference in thickness of the gate oxide film, it may be practical that a silicon oxide film about 10 nm thick is first formed on a surface of a transistor forming region of a substrate and, after a portion of this silicon oxide film which covers an internal circuit portion is removed, an oxidation is performed again.

Although the embodiments in which the protective circuit is arranged in the vicinity of the bonding pad 101 (Vdd) of the source terminal have been described, the circuit may be arranged in the vicinity of the bonding pad 101 (Vss) of the ground terminal. Further, it is possible to arrange protective circuits in the vicinity of the two bonding pads, respectively.

Although the present invention has been described with reference to specific embodiments, this description is not meant to be construed in a limiting sense. Various modifications of the disclosed embodiment, as well as other embodiments of the present invention, will become apparent to persons skilled in the art upon reference to the description of the present invention. It is therefore contemplated that appended claims will cover any modifications or embodiments as fall within the true scope of the present invention.

What is claimed is:

1. A semiconductor integrated circuit comprising:

a first power source bonding pad and a second power source bonding pad formed on an insulating film covering a semiconductor chip, said first power source bonding pad and said second power source bonding pad being applied with a first power source voltage and a second power source voltage, respectively;

a first power source wiring connected to and elongated from said first power source bonding pad;

a second power source wiring connected to and elongated from said second power source bonding pad;

an internal circuit connected between said first and second power source wiring to receive a voltage therebetween as a power source voltage, said internal circuit including an N-channel MOS FET and a P-channel MOS FET connected between said first and second power source wiring; and a protective circuit connected between said first and second power source wiring, said protective circuit including an N-channel MOS FET connected between said first power source wiring and said second power source wiring with a gate electrode thereof connected to said second power source wiring and a P-channel MOS FET connected between said first power source wiring and said second power source wiring, in parallel with said N-channel MOS FET, with a gate electrode thereof connected to said first power source wiring, drain unctions of said N-channel and P-channel MOS FETs breaking down to allow current discharge to occur through said N-channel and P-channel MOS FETs when said first power source voltage is an over voltage having a positive polarity.

2. The semiconductor integrated circuit claimed in claim 1, wherein said gate electrode of said N-channel MOS FET of said protective circuit is connected to said second power source wiring through a film resistor element and said gate electrode of said P- channel MOS FET of said protective circuit is connected to said first power source wiring through a film resistor element.

3. The semiconductor integrated circuit claimed in claim 1, wherein at least one of said N- and P-channel MOS FETs of said protective circuit has a drain breakdown voltage lower than a drain breakdown voltage of each of said N and P channel MOS FETs of said internal circuit.

4. The semiconductor integrated circuit claimed in claim 3, wherein each of said N- and P-channel MOS FETs of said internal circuit has a lightly-doped-drain structure.

5. A semiconductor device comprising a first power supply line applied with a first power voltage, a second power supply line applied with a second power voltage, an internal circuit connected between said first and second power supply lines to receive a voltage therebetween as a power supply voltage of said internal circuit, and a protective circuit connected between said first and second power supply lines to protect said internal circuit from an over voltage applied to one of or both of said first and second power supply lines, said protective circuit including an N-channel MOS transistor connected between said first and second power supply lines and having a gate, a P-channel MOS transistor connected between said first and second power supply lines, in parallel with said N-channel MOS FET, and having a gate, a first resistor connected between the gate of said N-channel MOS transistor and said second power supply line, and a second resistor connected between the gate of said P-channel MOS transistor and said first power supply line, drain junctions of said N-channel and P-channel MOS FETs breaking down to allow current discharge to occur through said N-channel and P-channel MOS FETs when said first power voltage is said over voltage having a positive polarity.

6. The semiconductor device as claimed in claim 5, wherein each of said first and second resistors comprises a polysilicon layer which further operates as the gate of the associated one of said N-channel and P-channel MOS transistors.

* * * * *

UNITED STATES PATENT AND TRADEMARK OFFICE
CERTIFICATE OF CORRECTION

PATENT NO.    : 5,449,940
DATED         : September 12, 1995
INVENTOR(S)   : Morihisa HIRATA It is certified that error(s) appears in the above-identified patent and that said Letters Patent is hereby corrected as shown below:

Col. 2, line 13, after "ability" insert --adversely--.

Col. 7, line 27, delete "M" and insert --Mn--.

Col. 8, line 10, before "formed" insert --are--.

Signed and Sealed this

Twenty-first Day of May, 1996

Attest:

BRUCE LEHMAN

Attesting Officer          Commissioner of Patents and Trademarks